United States Patent
Uchida et al.

[19]

[11] Patent Number: 5,889,325
[45] Date of Patent: Mar. 30, 1999

[54] SEMICONDUCTOR DEVICE AND METHOD OF MANUFACTURING THE SAME

[75] Inventors: Hiroyuki Uchida; Katsunobu Suzuki, both of Tokyo, Japan

[73] Assignee: NEC Corporation, Tokyo, Japan

[21] Appl. No.: 65,411

[22] Filed: Apr. 24, 1998

[51] Int. Cl.⁶ .................................................. H01L 23/34
[52] U.S. Cl. ...................... 257/724; 257/666; 257/664; 257/723
[58] Field of Search ................................ 257/666, 664, 257/723, 724, 536

[56] References Cited

U.S. PATENT DOCUMENTS 4,879,588 11/1989 Ohtsuka et al. .
5,399,905 3/1995 Honda et al. .

FOREIGN PATENT DOCUMENTS 2-104637 8/1990 Japan .
5-206202 8/1993 Japan .
8-97330 4/1996 Japan .

*Primary Examiner*—Mahshid Saadat
*Assistant Examiner*—S. V. Clark
*Attorney, Agent, or Firm*—Foley & Lardner

[57] ABSTRACT

A semiconductor device includes an insulation film formed on a metal substrate, wiring patterns formed on the insulation film, and electrodes of a semiconductor chip connected to one ends of the wiring patterns, wherein a plurality of resistors are formed on at least one of surfaces of a front and a back of the insulation film and one ends of the resistors are connected to the electrodes of semiconductor chip through the wiring patterns.

16 Claims, 6 Drawing Sheets

10: metal leaf

20: insulation protecting film
18a: external terminal connecting portion

FIG.8 (a) (PRIOR ART)
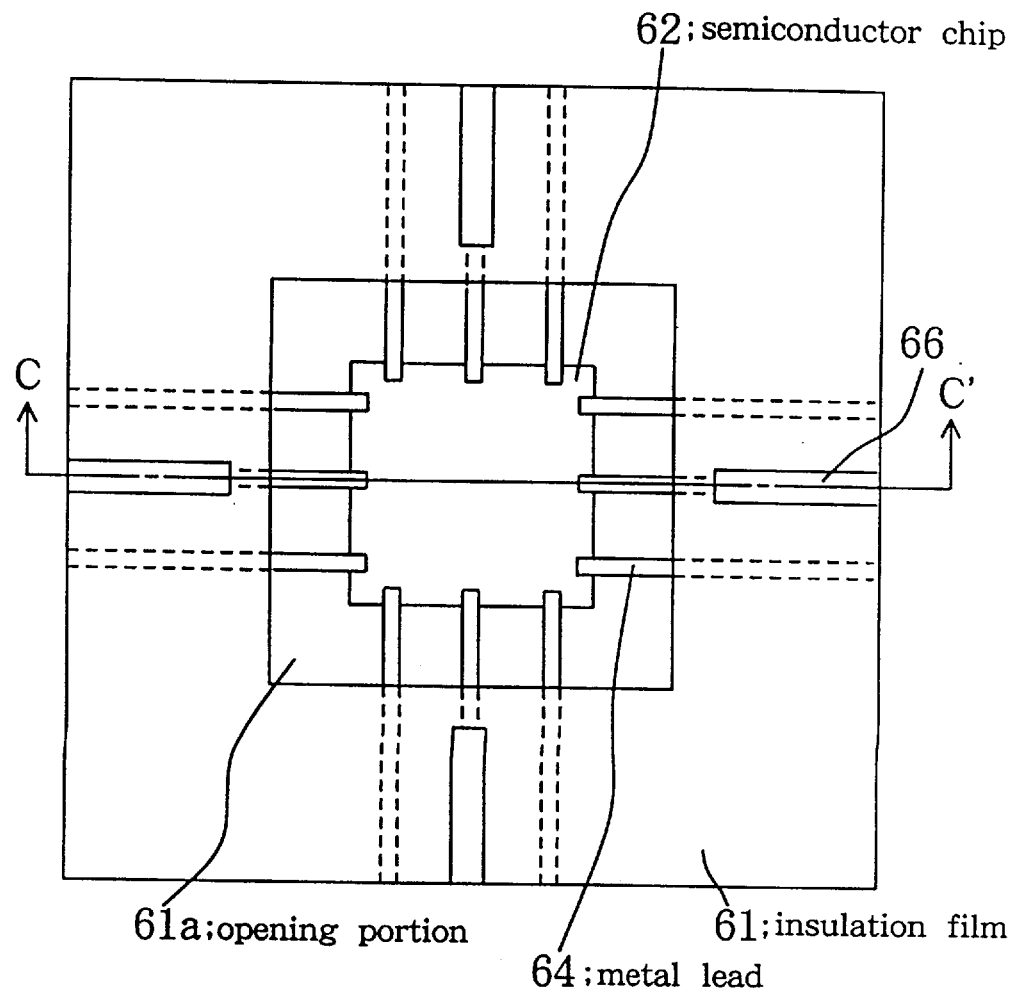
FIG.8 (b) (PRIOR ART)
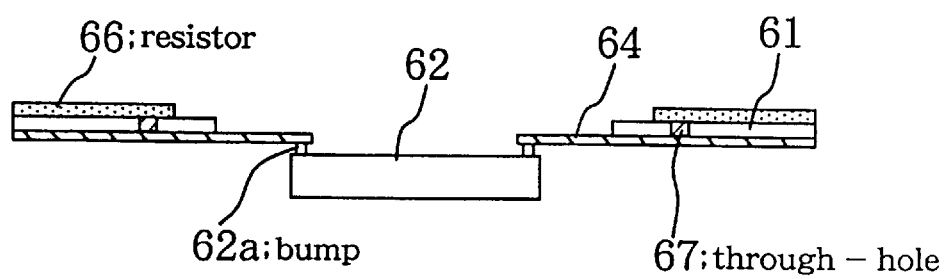

SEMICONDUCTOR DEVICE AND METHOD OF MANUFACTURING THE SAME

BACKGROUND OF THE INVENTION

1. Field of the Invention

The present invention relates to a semiconductor device and method of manufacturing the same, more particularly to a semiconductor device having a semiconductor chip in a package with wiring patterns of microstrip structure and terminators, and a method of manufacturing such device.

2. Description of the Related Art

In case of a high speed LSIs (Large Scale Integrated Circuit), a signal line requires to be connected to a terminator since signal reflection should be restrained to prevent operation from malfunction caused by a waveform distortion. Because of this, there have proposed terminators incorporated in a package which houses an LSI chip to make it possible in high density mounting, instead of externally mounting those on the package.

Japanese Laid-Open Patent Application No. Hei5-206202 has proposed such a semiconductor device. FIG. 8(a) is a plan view showing the semiconductor device proposed in the application, and FIG. 8(b) is a sectional view indicative of the arrows C–C' shown in FIG. 8 (a) Referring to FIGS. 8(a) and 8(b), a metal lead 64 is formed on a lower surface of an insulation film 61 made up of polyimide resin having an opening portion 61a so that the end portion of metal lead 64 is extruded to the opening portion 61a. A resistor 66 used for a terminator comprised of either a thin-film or thick-film is formed on the upper surface of insulation film 61. One end of the resistor 66 is connected to the metal lead 64 via a through hole 67 formed on the insulation film 61. In addition, a bump 62a formed on a semiconductor chip 62 is connected to the end portion of metal lead 64, mounting the semiconductor chip 62 on the opening portion 61a.

It is noted that the value of resistor 66 is a value to be matched with the characteristic impedance of metal lead 64 which becomes a transmission path. The through hole 67 is formed extremely close to the opening portion 61a to desirably restrain reflection in the transmission path.

Accordingly, with the terminator mounted on the package, a simple and high density mounting can be achieved, and with use of a micro process for forming either thin or thick film to be readily made the terminator, resistance accuracy can be enhanced.

In such case of the semiconductor device described above, the reflection restraint effected by the terminator may be small since the metal lead 64 as a transmission path of the package is not a structure so that a characteristic impedance variation such as a microstrip path becomes small.

The external connection also has limitation around the peripheral portion package. Besides, the end portion of terminator has open, therefore, electrical connections for such grounding potential and source potential of the terminator should be placed around the peripheral portion of package when mounting the semiconductor device on a printed circuit board. Thus, reductions of mounting area and mounting man-hour cannot be made sufficiently. Particularly, in case of increasing the number of connecting pins, there arises difficulty of mounting the device on a printed circuit board due to the connecting congestion around the peripheral portion of package.

In addition, with necessity for forming the terminator on the insulation film 61, use of a thin-film causes high cost since its manufacturing method is limited to the vapor deposition. In case of using a thick-film method (or printing method), there arises drawback that variation of resistance value becomes large. In also case of using the thin-film method and electrodeposition method (or plating method), the yield is generally as much as −10 to +10% per a desirable resistance value, while in case of using the printing method, the yield is over −20 to +20%.

SUMMARY OF THE INVENTION

It is therefore an object of the present invention to provide a semiconductor device and method of manufacturing the same for connecting an end portion of terminator to a conductor within a package.

It is another object of the present invention to provide a semiconductor device and method of manufacturing the same having that wiring patterns in the package has a microstrip structure.

It is still another object of the present invention to provide a semiconductor device and method of manufacturing the same having a package structure capable of adopting a number of connecting pins.

It is still another object of the present invention to provide a semiconductor device and method of manufacturing the same capable of incorporating terminators in low cost and high accuracy.

According to a first aspect of the present invention, there is provided a semiconductor device including: an insulation film formed on a metal substrate and wiring patterns formed on the insulation film; resistors formed on either a lower or an upper surface of the insulation film; and opening portions formed on the metal substrate and external terminals formed in the opening portions.

According to a second aspect of the present invention, there is provided a method of manufacturing the semiconductor device including the steps of: forming an insulation film on a metal substrate and wiring patterns on the insulation film; forming resistors on either a lower or an upper surface of the insulation film; and forming opening portions on the metal substrate and external terminals in the opening portions.

According to the aspects of the present invention described above, the semiconductor device includes that the insulation film is formed on the metal plate on which the signal wiring patterns are formed, and the terminators are arranged on either the upper surface or lower surface of the insulation film. Therefore, the terminators can be terminated in the package, enhancing a packaging density and reducing a man-hour of the mountings. The signal wiring patterns have microstrip structure, making the characteristic impedance stable and also making the reflection restraint effect of the terminators stable. In addition, the resistors can be formed by the electrodeposition method, so that the semiconductor device having terminators can be manufactured in low cost and high accuracy.

BRIEF DESCRIPTION OF THE DRAWINGS

The above and other objects, advantages and features of the present invention will be more apparent from the following description taken in conjunction with the accompanying drawings in which:

FIG. 8(a) is a plan view showing a semiconductor device for explaining a related art; and FIG. 8(b) is a sectional view indicative of the arrows C–C' shown in FIG. 8(a).

DESCRIPTION OF THE PREFERRED EMBODIMENTS

Figure 1A:
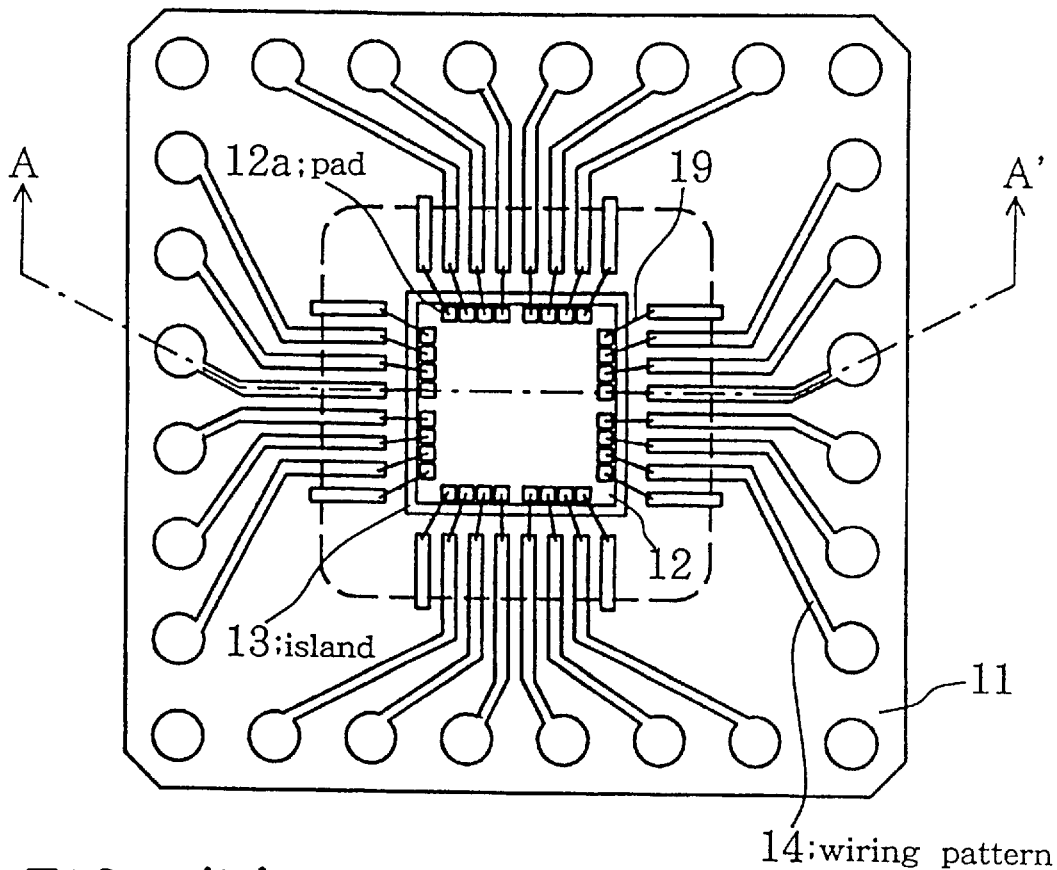
FIG. 1(a) is a plan view showing a semiconductor device in a first embodiment of the present invention.

Firstly, the present invention will be described briefly with reference to FIGS. 1(a) to 1(b), FIG. 2, FIGS. 3(a) to 3(g), FIGS. 4 to 6 and FIGS. 7(a) to 7(b). A semiconductor device of the present invention comprises: an insulation film (11, 41) formed on a metal substrate (15, 25, 35, 45, 55); wiring patterns (14, 24, 34, 44, 54, 54a, 54b) formed on the insulation film; and electrodes (12a) of a semiconductor chip (12, 42, 52) connected to one ends of the wiring patterns, in which the upper or back surface of insulation film has resistors (16, 26, 36, 46, 56), one ends of which are connected to the electrodes of semiconductor chip through the wiring patterns.

The metal plate desirably has openings around the peripheral portion thereof where externally connecting terminals (18, 18a, 38, 38a) are arranged thereon. The externally connecting terminals are formed in the openings to be connected to the wiring patterns via through-holes (17b, 37) formed on the insulation film.

A method of manufacturing the semiconductor device comprises the steps of: (1) forming resistors on a metal plate as illustrated on FIG. 3(a); (2) bonding either an insulation film and a metal leaf or a metal leaf-attached insulation film on the metal plate as illustrated on FIGS. 3(b) and 3(c); (3) patterning the metal leaf to form wiring patterns as illustrated on FIG. 3(d); (4) forming openings on the insulation film selectively and a conductive layer in the openings to form through-holes for connecting at least the wiring patterns, the resistors and the metal plate as illustrated on FIGS. 3(e) and 3(f); (5) etching the metal plate selectively to partially expose the resistors and separating a part of the metal plate from other parts as externally connecting terminals as illustrated on FIG. 3(g); and (6) connecting electrodes of a semiconductor chip to one ends of the wiring patterns.

In the step (1), the resistors may desirably be formed by the electrodeposition method. The resistors may also be formed on the back surface of metal leaf instead of forming those on the metal plate.

More specifically, embodiments of the present invention will be described with reference to the drawings.

[First Embodiment]

Figure 1B:
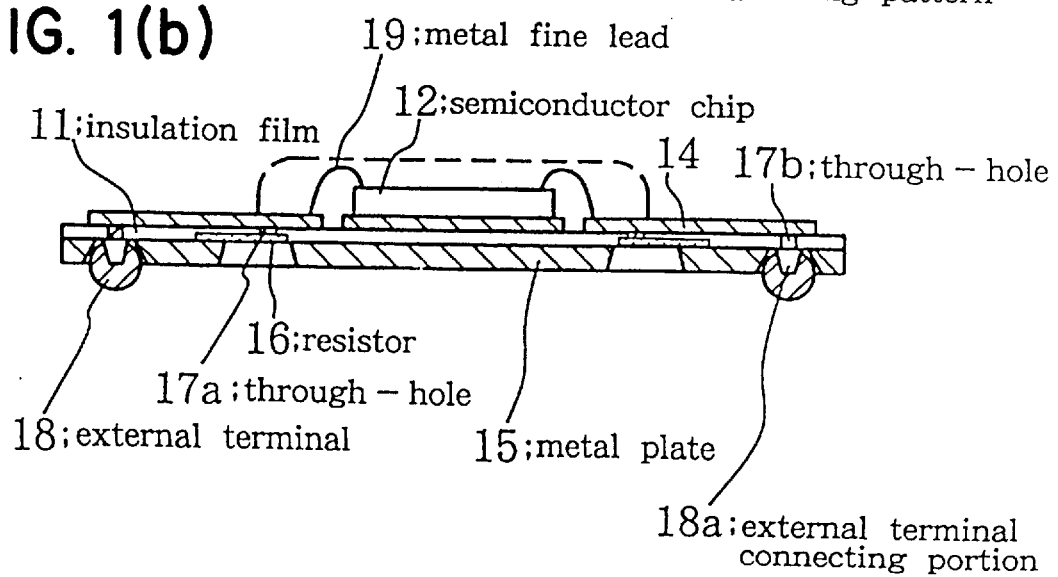
FIG. 1(b) is a sectional view indicative of the arrows A–A' shown in FIG. 1(a)
Figure 2:
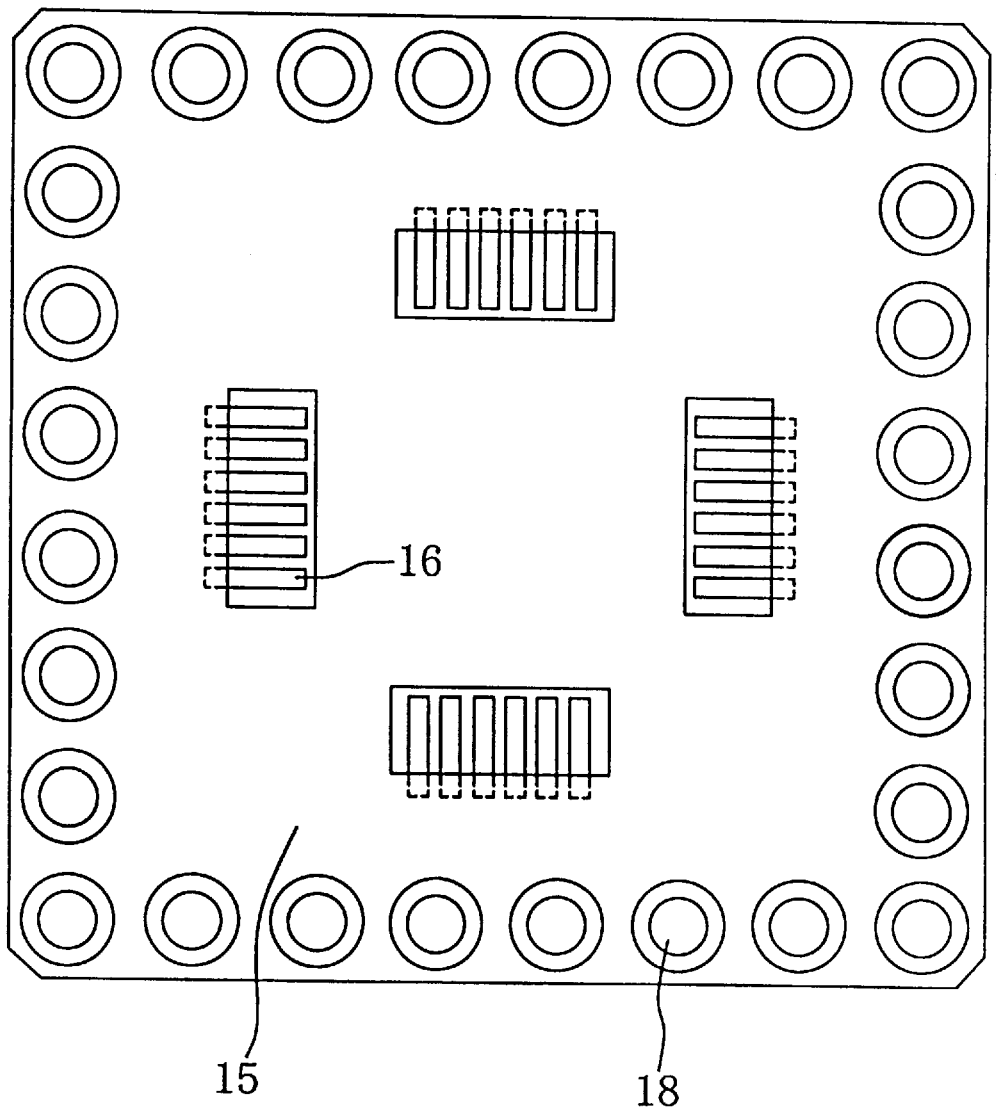
FIG. 2 is a bottom view showing the semiconductor device in the first embodiment of the present invention.

FIG. 1(a) is a plan view showing a semiconductor device in a first embodiment of the present invention. FIG. 1(b) is a sectional view indicative of the arrows A–A' shown in FIG. 1(a). FIG. 2 is a bottom view of the semiconductor device shown in FIG. 1(a).

Referring to FIG. 1(a), FIG. 1(b) and FIG. 2, an island 13 to be mounted a semiconductor chip 12 is formed on a central portion of an insulation film 11, the thickness of which is as much as 10 to 100 82 m and made of polyimide material wiring patterns 14 are then radially formed around the island 13 so as to be surrounded by the patterns. The island 13 and wiring patterns 14 on one surface of the insulation film 11 are formed by a metal leaf having 5 to 50 $\mu$m in thickness and made up of such as copper, aluminum and the like. A metal plate 15 is bonded on the other surface of insulation film 11 opposite to forming the wiring patterns 14 to enhance rigidity of entire package. The metal plate 15 is composed of such as copper and stainless steel of 100 to 200 $\mu$m in thickness, and it is connected to the grounding potential.

Resistors 16 made up of a metal material such as a nickel-chromium alloy are formed on junction surfaces between the metal plate 15 and insulation film 11 in which the sheet resistance of the resistors 16 is relatively high. Since the resistors 16 should be a material which is not suffered from corrosion and damage when etching the metal plate 15 and wiring patterns 14, and the nickel-chromium alloy is an excellent chemical resistance material. In the case of nickel-chromium alloy, it is possible to make resistors having a 50 to 55 Ω per 0.1 $\mu$m in thickness and 1.0 mm in length.

As shown in FIG. 1(a), one end of the resistor 16 is connected to the metal plate 15 being connected to the ground potential and the other end thereof is connected to the wiring pattern 14 via the through-hole 17a formed on the insulation film 11. The metal plate 15 to be formed the resistor 16 is removed with an etching process except a connecting portion thereof to the resistor 16. The through-hole 17a is a hole formed by etching the insulation film 11 selectively in which the hole is buried with the plating process of such copper or nickel.

A semiconductor chip 12 is mounted on the island 13 via a bonding material such as a silver paste, and a pad 12a formed on the semiconductor chip 12 is connected to one end of the wiring pattern 14 by a metal fine lead 19 made of gold or aluminum. The other end of wiring pattern 14 is connected with an external terminal 18 formed of a low melting point metal such as solder, via a through-hole 17b and an external terminal connecting portion 18a.

The portions of semiconductor chip 12 and metal fine lead 19 are sealed up with a resin shown by the dotted line in FIG. 1(a).

Manufacturing method of the first embodiment illustrated on FIGS. 1(a), 1(b) and FIG. 2 will be described below. FIGS. 3(a) to 3(g) are sectional views showing the steps of the manufacturing method.

First, a resist film having an opening (not shown in the drawing) is formed on a resistor forming region of the metal plate 15 by the photolithography method. Resistors 16 made of a nickel-chromium alloy are also formed by an electrodeposition method. The resist film as a mask is then removed, as shown in FIG. 3(a).

Figure 3:
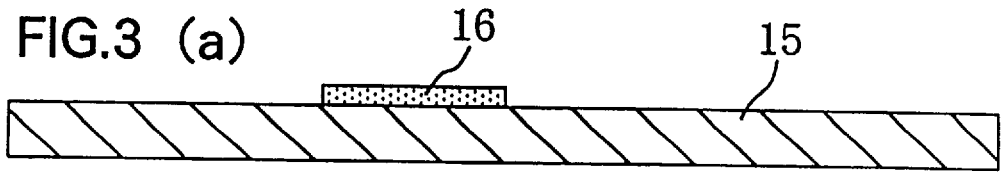
FIGS. 3(a) to 3(g) are sectional views showing manufacturing steps of the semiconductor device in the first embodiment of the present invention.
Figure 3:
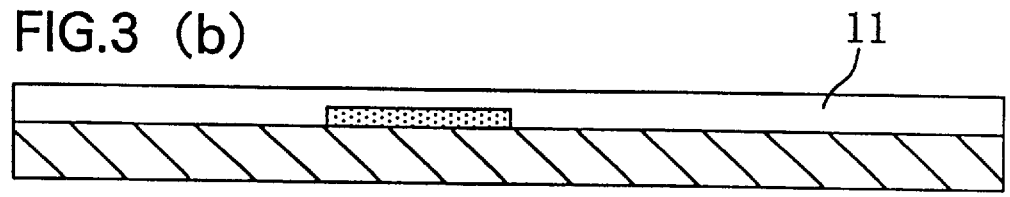
Figure 3:
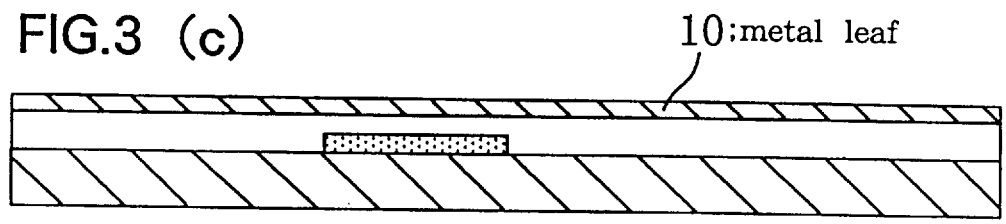
Figure 3:
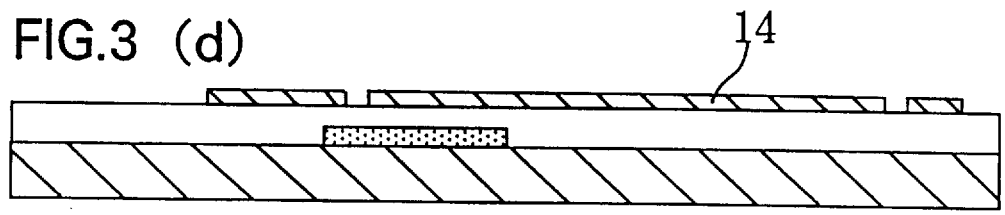
Figure 3:
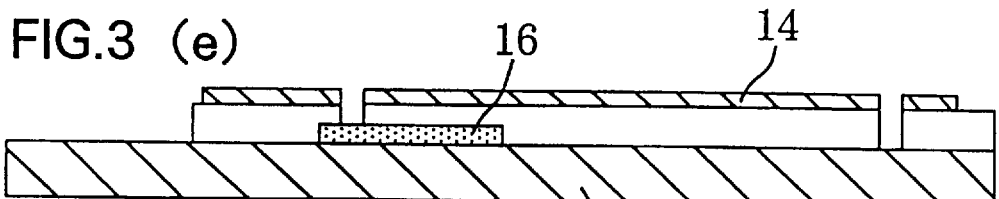
Figure 3:
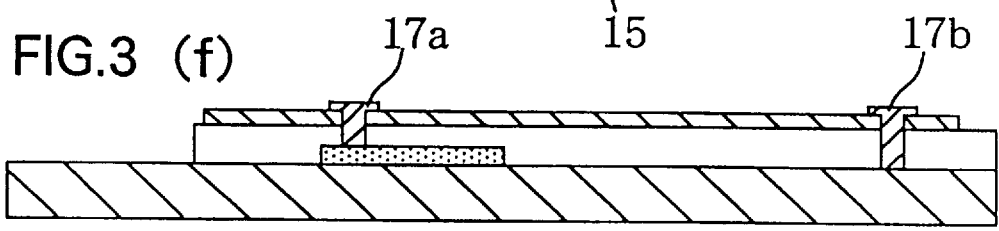
Figure 3:
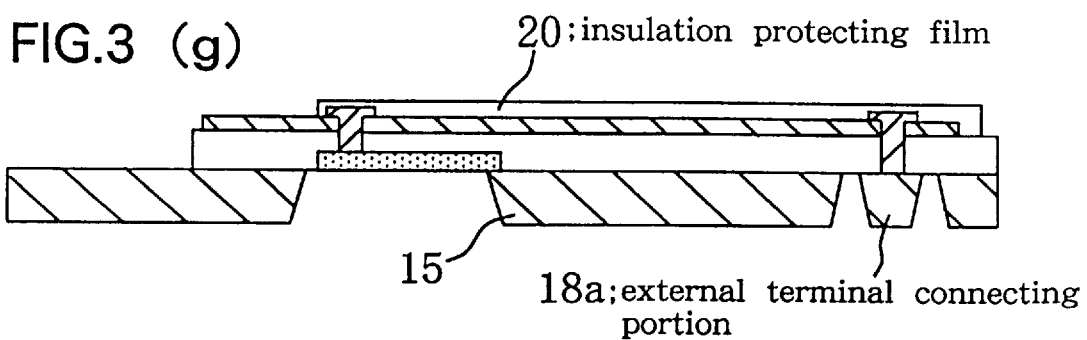

Subsequently, the insulation film 11 made of such as polyimide material is bonded on a surface where the resistors 16 are formed on the metal plate 15 as shown in FIG. 3(b). A metal leaf 10 for forming the wiring patterns is bonded on the insulation film 11 as shown in FIG. 3(c). The bonding processes are carried out by use of either an organic bonding material such as a polyimede type bonding material or a vacuum compressed bond. A metal leaf laminated on a polyimede resin film such as copper laminated resin film may be bonded on the metal plate 15.

The metal leaf 10 is then patterned with a desirable shape by the photoetching method to form the wiring patter 14 as shown in FIG. 3(d). Similarly, the insulation film 11 is etched to form an opening where a through-hole is formed as shown in FIG. 3(e). At this time, in the case where the semiconductor chip 12 is die-bonded on the metal plate 15 without forming the island 13 of the metal leaf 10, the insulation film 11 for a die bonding region is also etched and removed previously. A copper or nickel plating is then applied to the opening of insulation film 11 to form the through-hole 17a to be connected with the wiring pattern 14 and the resistor 16, and also form the through-hole 17b to be connected with the wiring pattern 14 and the metal plate 15, as shown in FIG. 3(f). With the etching process applied to the metal plate 15 selectively, the surface of resistor 16 to be formed is exposed except for a portion to be connected to the wiring pattern 14. The external terminal connecting portion 18a of the metal plate 15 connected to the through-hole 17b is then separated from the metal plate 15. The wiring pattern 14 is coated with an insulation protecting film 20 except for a bonding area thereof, as shown in FIG. 3(g). After that, an external terminal is formed on the external terminal connecting portion 18 with use of a low melting point metal to thereby form a semiconductor device when mounting the semiconductor chip 12 as a first embodiment shown in FIGS. 1(a), 1(b) and FIG. 2. It is noted that the semiconductor chip 12 is bonded on the island 13 formed on the insulation film 11, but should be die-bonded on the metal plate 15 in the case of showing the steps in FIGS. 3(a) to 3(g).

[Second Embodiment]

Figure 4:
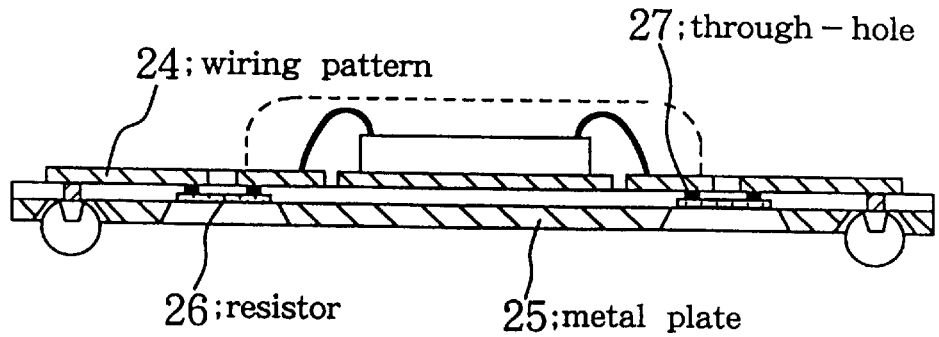
FIG. 4 is a sectional view showing a semiconductor device in a second embodiment of the present invention.

FIG. 4 is a sectional view showing a semiconductor device in a second in embodiment of the present invention. In this case, both the ends of resistor 26 are connected to a wiring pattern 24 via a through-hole 27. That is, the resistor 26 is connected to the wiring pattern in series.

Since the resistor 26 is not required to connect to a metal plate 25 in this embodiment, the metal plate 25 in a resistor forming region is completely removed by the etching process.

Such a connecting structure of terminator is referred to as a serial terminator in general, which is frequently employed in a path type wiring for bi-directional signal transmission.

[Third Embodiment]

Figure 5:
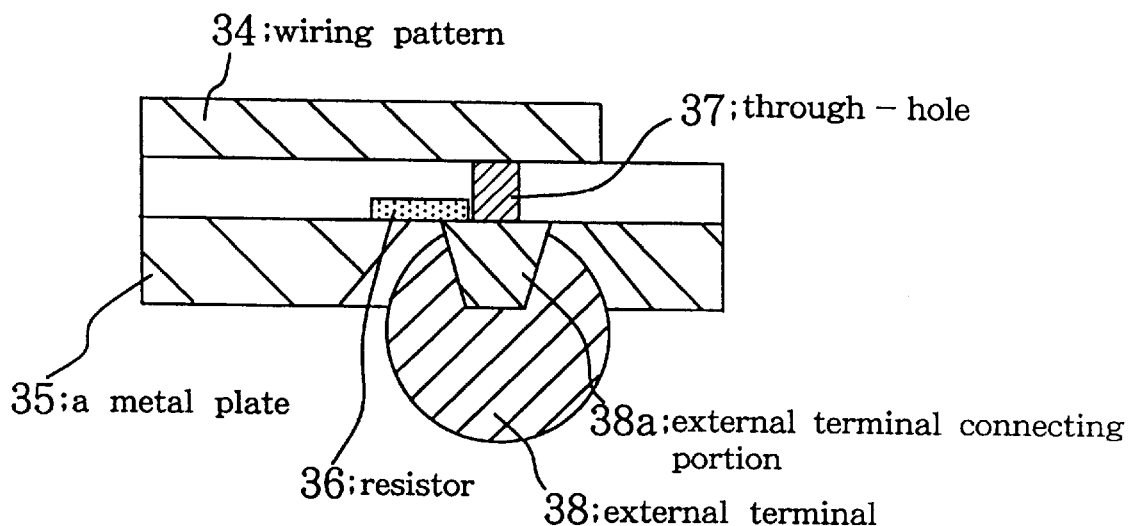
FIG. 5 is a sectional view showing a major part of a semiconductor device in a third embodiment of the present invention.

A third embodiment of the present invention will be described with reference to FIG. 5. FIG. 5 is a sectional view showing a part of an external terminal. In this case, one end of a resistor 36 is connected to a metal plate 35 and the other end thereof is connected to an external terminal connecting portion 38a connected with a wiring pattern 34 via a through-hole 37. The external terminal connecting portion 38a is a metal plate portion separated from the major part of metal plate 35 by the etching process. An external terminal 38 is then formed as a low melting point metal ball.

In the case of structure shown in FIG. 5, with the resistor 36 arranged close to the external terminal connecting portion 38a, the metal plate 35 close to a semiconductor chip to be mounted on is not required to remove, so that the metal plate used for a power or grounding potential lead serves as high radiating heat.

[Fourth Embodiment]

Figure 6:
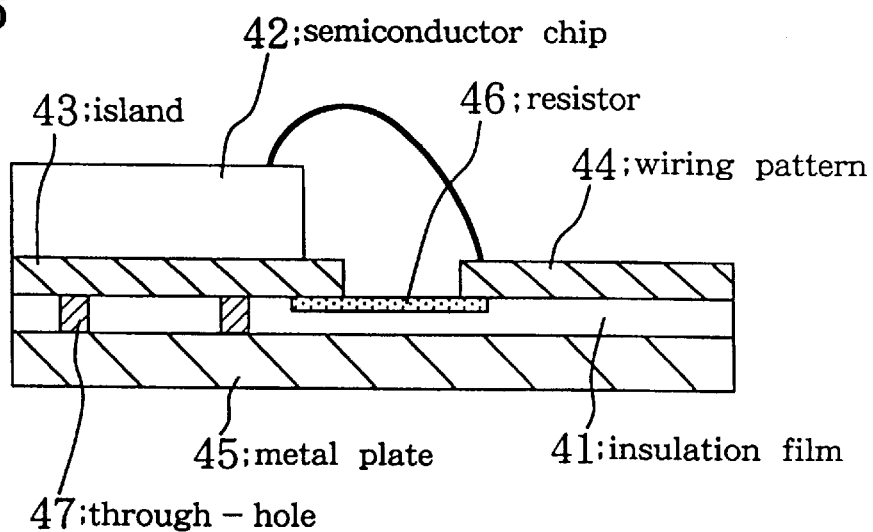
FIG. 6 is a sectional view showing a major part of a semiconductor device in a fourth embodiment of the present invention.
Figure 7:
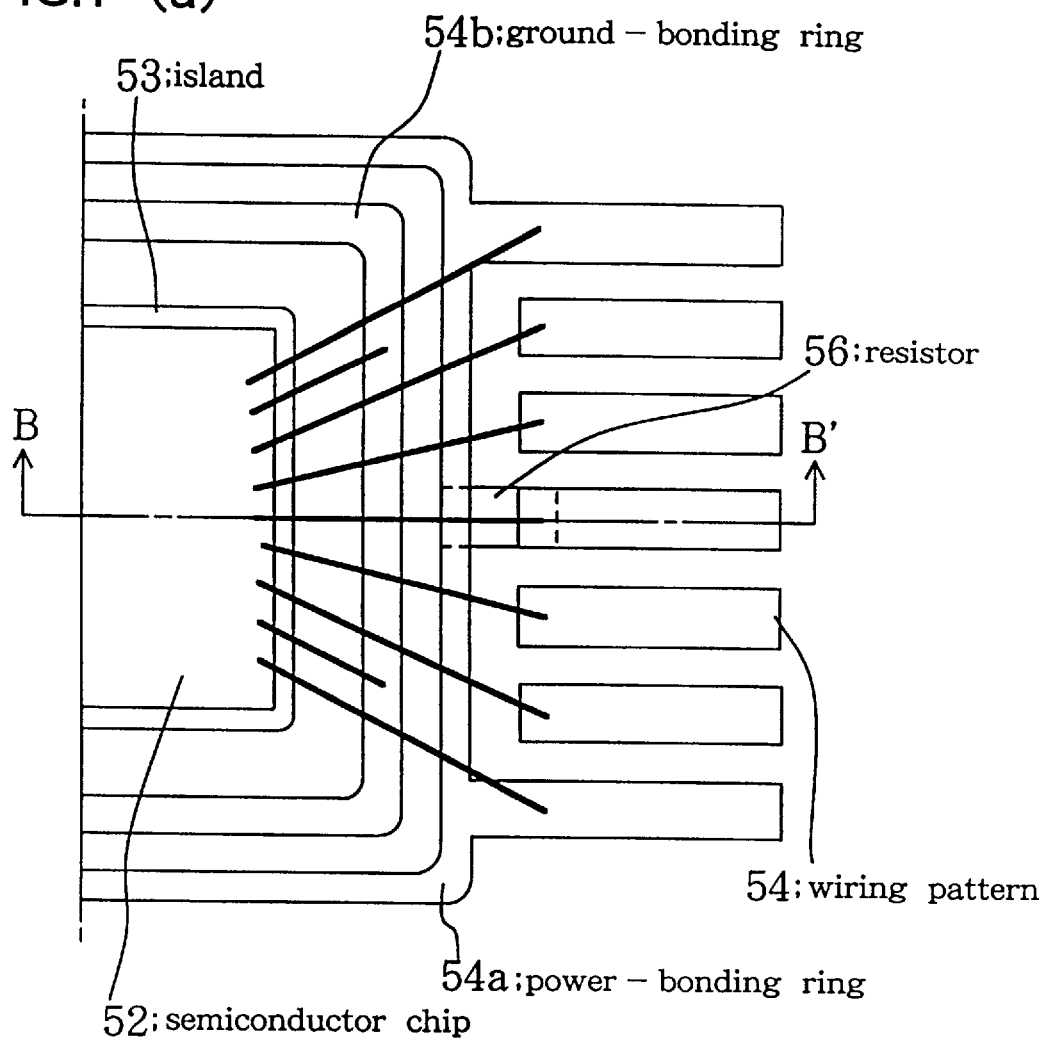
FIG. 7(a) is a partially illustrated plan view showing a semiconductor device in a fifth embodiment of the present invention.
FIG. 7(b) is a sectional view indicative of the arrows B–B' shown in FIG. 7(a)
Figure 7:
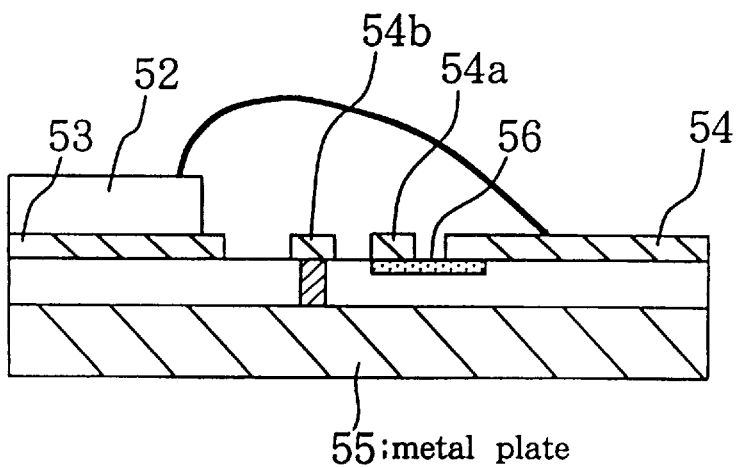

A fourth embodiment of the present invention will be described with reference to FIG. 6. FIG. 6 is a sectional view showing a part of mounting a semiconductor chip. In this case, a resistor 46 is formed on a side of a metal leaf on an insulation film 41 and arranged between an island 43 and a wiring pattern 44. The resistor 46 is formed on the metal leaf by the electrodeposition method, in which the metal leaf is bonded on the insulation film 41 and it is patterned with the etching process to expose a part thereof.

Feature of this embodiment is that the resistor 46 is arranged on the closest position to a semiconductor chip 42, so that it is possible to make the restraining effect of signal reflection maximum, but a micro process for forming the resistor is required.

[Fifth Embodiment]

A fifth embodiment of the present invention will be described next. FIG. 7(a) is a plan view showing a part of mounting a semiconductor chip and FIG. 7(b) is a sectional view indicative of the arrows B–B' shown in FIG. 7(a).

In the case of this embodiment, annularly shaped power-bonding ring 54a and ground-bonding ring 54b are formed between an island 53 and wiring patterns 54, and a resistor 56 is formed between the wiring pattern 54 and the power-bonding ring 54a. The power-bonding ring 54a is connected to a part (a wiring at a corner portion in FIG. 7 (a)) of wiring pattern 54 to be brought out to an external terminal. The ground-bonding ring 54b is connected with a metal plate 55 via the through-hole. Therefore, the wiring pattern is made a microstrip structure and a terminator is grounded between signal wiring and power wiring.

In this embodiment, the resistor 56 is formed on the side of metal leaf where the wiring pattern 54 is formed, which is similar to the fourth embodiment.

In the embodiments described above, the pads of a semiconductor chip are connected with the wiring patterns by the wire bonding, but a semiconductor chip may be used of the flip chip type which are bonded to the wiring patterns by the face down bonding method. The external terminals may be not only arranged around the peripheral portion of package, but also arranged at the central bottom portion of the package (so-called area arrangement).

It is thus apparent that the present invention is not limited to the above embodiments but may be changed and modified without departing from the scope and spirit of the invention.

What is claimed is:

1. A semiconductor device including an Insulation film formed on a metal substrate, a plurality of wiring patterns formed on the insulation film, and electrodes of a semiconductor chip connected to one ends of the wiring patterns, wherein a plurality of resistors are formed on at least one of surfaces of a front and a back of the insulation film and one end of each of the resistors is connected to the electrodes of the semiconductor chip through each of the plurality of wiring patterns.

2. A semiconductor device according to claim 1, wherein an opening is formed on an external terminal forming portion of the metal plate, and an external terminal connected to the wiring pattern is formed via a through-hole formed on the insulation film.

3. A semiconductor device according to claim 1, wherein the resistor is formed on the back of insulation film, one end of the resistor is connected to the wiring pattern via a through-hole, and other end of the resistor is connected to the metal plate.

4. A semiconductor device according to claim 3, wherein the resistor is formed on the front surface of the insulation film, and the other end of resistor is connected to both the wiring pattern and a conductor layer formed on the insulation film.

5. A semiconductor device according to claim 1, wherein an island is formed on the insulation film, the semiconductor chip is mounted on the island, and the electrode of the semiconductor chip is connected to the wiring pattern by a metal fine lead.

6. A semiconductor device, comprising: a metal plate having external terminal forming portions for forming openings, an insulation film provided on the metal plate;

a plurality of wiring patterns formed on the insulation film;

external terminals formed in the opening of the metal plate and connected to the wiring patterns via through-holes formed on the insulation film; and a semiconductor chip provided and electrodes of the semiconductor chip connected to one ends of the wiring patterns; and a plurality of resistors formed on a surface selected from one of a front and back of the insulation film an one end of each of the resistors is connected to the electrode of the semiconductor chip through each of the plurality of patterns.

7. A semiconductor device according to claim 6, wherein the plurality of resistors are formed on the back of the insulation film.

8. A semiconductor device according to claim 7, wherein one ends of the resistors are connected to the wiring patterns via the through-holes and other ends of the resistors are connected to the electrodes of the semiconductor chips.

9. A semiconductor device according to claim 6, wherein the openings have the external terminal forming portions, respectively, which are connected to the wiring patterns via the through-holes formed on the insulation film.

10. A semiconductor device according to claim 9, wherein the plurality of resistors are arranged close to the through-holes, one ends of the resistors are connected to the external terminal forming portions and other ends of the resistors are connected to the metal plate.

11. A semiconductor device according to claim 10, wherein the external terminal forming portions are formed of parts of the metal plate connected to the wiring patterns via the through-holes.

12. A semiconductor device according to claim 11, wherein the external terminal forming portions include the external terminals of low melting point metal balls, respectively.

13. A semiconductor device according to claim 6, wherein the plurality of resistors are formed on the front of the insulation film.

14. A semiconductor device according to claim 6, wherein the plurality of resistors include pieces of metal leaf formed on the insulation film.

15. A semiconductor device according to claim 14, wherein one ends of the resistors are connected to the wiring patterns and other ends of the resistors are connected to the metal plate via the through-holes formed on the insulation film.

16. A semiconductor device according to claim 6, Further comprising, a power bonding ring and a ground bonding ring formed on the insulation film such that both the power and ground bonding rings surround the semiconductor chip, and the resistors are connected between the wiring patterns and the power bonding ring.

* * * * *